(12) United States Patent
Uchida et al.

(10) Patent No.: US 6,787,795 B2
(45) Date of Patent: Sep. 7, 2004

(54) LOGIC APPARATUS AND LOGIC CIRCUIT

(75) Inventors: Ken Uchida, Sagamihara (JP); Junji Koga, Yokosuka (JP); Ryuji Ohba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 342 days.

(21) Appl. No.: 09/990,362

(22) Filed: Nov. 23, 2001

(65) Prior Publication Data
US 2002/0096740 A1 Jul. 25, 2002

(30) Foreign Application Priority Data
Nov. 24, 2000 (JP) ........................................ 2000-357789

(51) Int. Cl.[7] .............................................. H01L 29/06
(52) U.S. Cl. .............................. 257/30; 257/9; 257/39; 257/532; 257/536; 257/553
(58) Field of Search ................................ 257/9, 30, 39, 257/532, 536, 553

(56) References Cited
U.S. PATENT DOCUMENTS 5,838,021 A * 11/1998 Ancona ........................ 257/30
5,963,471 A * 10/1999 Ohata et al. ................. 365/174
6,060,748 A   5/2000 Uchida et al.
6,487,112 B1 * 11/2002 Wasshuber ................... 365/163

OTHER PUBLICATIONS

Hitoshi Kume, et al., "Flash Memory Technology", Central Research Laboratory, Hitachi Ltd., Nov. 1996, pp. 1114–1124.
T. Sueyoshi, "Reconfigurable Computing", IPSJ Magazine, vol. 40, No. 8, Aug. 1999, pp. 777–782.

* cited by examiner

Primary Examiner—Tom Thomas
Assistant Examiner—Matthew E. Warren
(74) Attorney, Agent, or Firm—Oblon, Spivak, McClelland, Maier & Neustadt, P.C.

(57) ABSTRACT

A logic apparatus having first and second single-electron devices connected serially or in parallel. Each of the single-electron devices includes a conductive island insulatively disposed between two tunnel barriers, which separate the conductive island from respective source/drain electrodes. A first charge storage region is insulatively disposed over and under the conductive island and a gate electrode, respectively. When charges are accumulated in the charge storage region, a Coulomb oscillation of the respective device is shifted by a half-period from the Coulomb oscillation that results when no charge has accumulated therein.

26 Claims, 10 Drawing Sheets

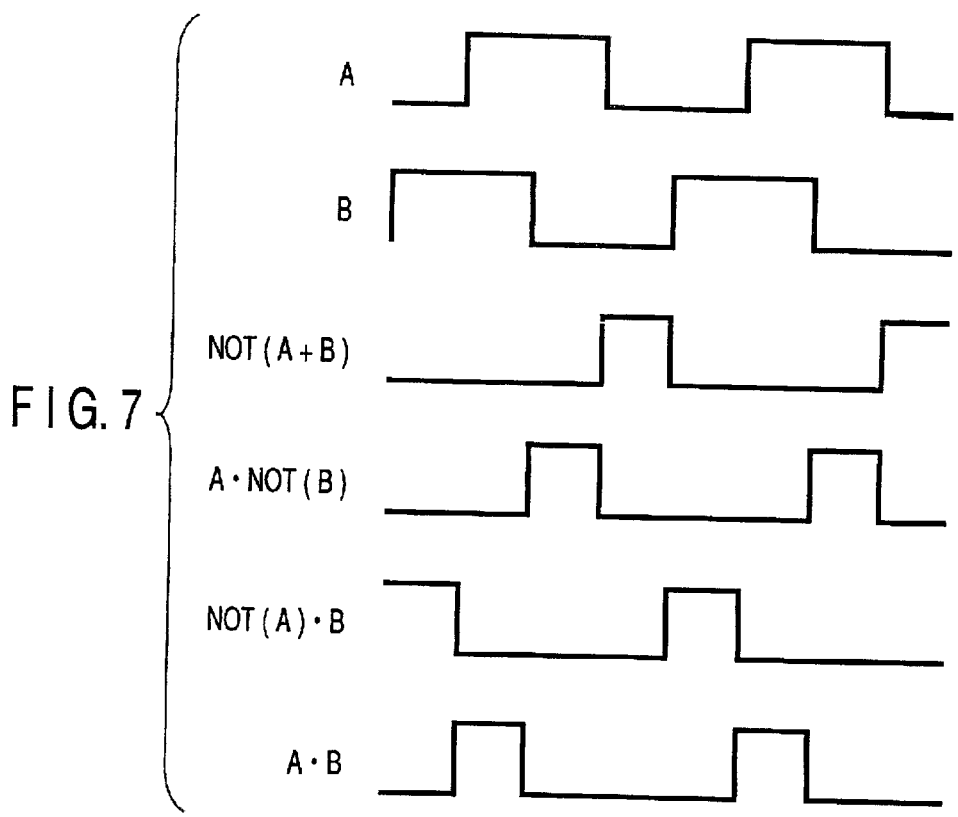
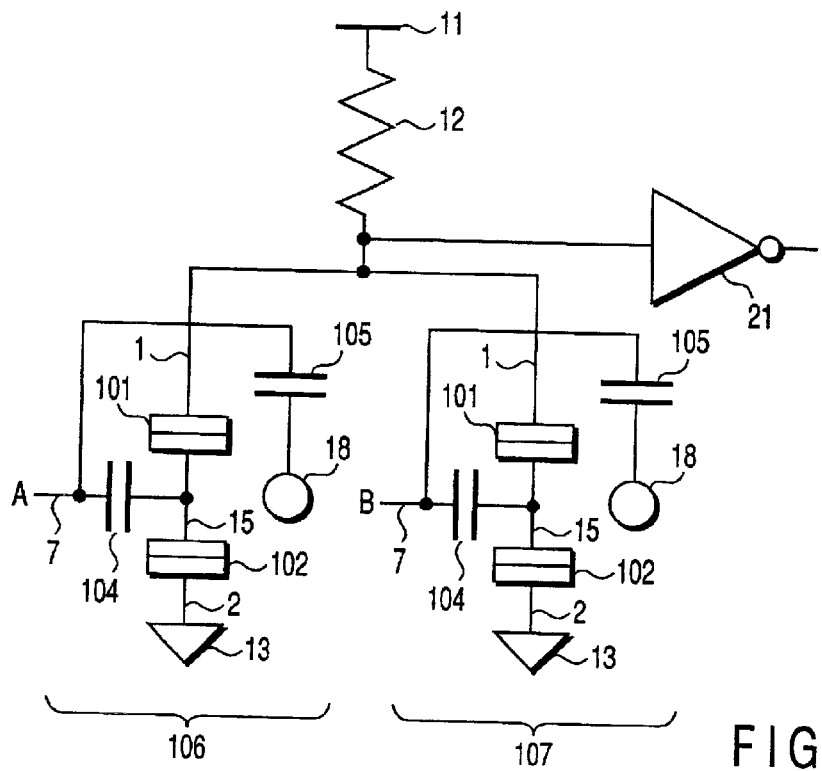

Initial / After applying -15V erasing voltage

After applying 8V writing voltage

After applying 15V writing voltage

LOGIC APPARATUS AND LOGIC CIRCUIT

CROSS-REFERENCE TO RELATED APPLICATIONS

This application is based upon and claims the benefit of priority from the prior Japanese Patent Application No. 2000-357789, filed Nov. 24, 2000, the entire contents of which are incorporated herein by reference.

BACKGROUND OF THE INVENTION

1. Field of the Invention

The present invention relates to a logic apparatus and a logic circuit using a single-elemental device which utilizes charging effect of a single elemental charge.

2. Description of the Related Art

A conventional semiconductor integrated circuit device (LSI) is designed according to the function before manufacture, and fabricated by integrating transistors and wiring on a semiconductor chip. For this reason, after manufacture, the LSI cannot change its structure and function. For this reason, many kinds of LSI have been made according to a use.

In contrast, there have been developed a general-purpose chip including LSI such as gate array capable of adding an operation process function met for use with a user after having shipped. However, the degree of freedom of the design of the chip is extremely low. In conventional gate arrays, a user must perform a manufacturing process to form wiring for connecting gates. Therefore, semiconductor manufacturing processes such as evaporation, exposure, developing, and so on is needed. For this reason, a user must have semiconductor production facility.

From such situation, in late years, design concept as referred to as reconfigurable computing (for example, Sueyoshi et al., "information processing" vol. 40 No. 8, page 778) attracts attention as guiding principle of a system design of the next generation. This reconfigurable computing is a technology that can change an operation process function of LSI by a simple operation according to the use desired by a user, if a general purpose semiconductor chip is prepared.

The reconfigurable computing technology differs from a conventional gate array technology that it does not need a semiconductor manufacturing process such as wiring, and enables a change of a logic operation by a simple method such as changes of a program.

If LSI that the reconfigurable computing is possible can be realized, remarkable improvement of process yield can be expected by producing a small kind of basic LSI in large quantities and changing them in many kinds of functions by a simple method.

It is necessary for realizing the reconfigarable computing to provide a function that make an optimized operation store in a logical element as a minimum configuration element for performing a logic operation and rewrite it according to a use. Nonvolatile memories such as EEPROMs have been made research as a logic element to use in the configurable computing (Kume, "Oyo Butsuri" Vol. 65, No. 11, page 1114).

In a flash memory using flash memory cells as EEPROM, when electrons are injected into a floating gate electrode, the threshold of MOSFET increases. Under a certain gate bias condition, it is possible to control ON/OFF of a current by an injection state of electrons. Also, the injected charges can be removed by setting a bias condition properly.

As described above, EEPROM has been looked at as a logic element of an advanced system to which a reconfigurable computing can be applied by virtue of the programmability. However, EEPROM includes problems such as a high drive voltage and an insufficient holding time.

Further, EEPROM can control only ON/OFF of a current, so that optimization of a system (a program) must be performed by merely switching of ON/OFF of the current. For this reason, a great number of elements are required in the formation of a programmable function block.

The object of the present invention is to provide a logic device enabling a reconfigurable computing which can expect high yield by using logic elements having a low drive voltage and a good holding characteristic.

BRIEF SUMMARY OF THE INVENTION

An aspect of the invention, there is provided a logic circuit apparatus comprising: a semiconductor substrate; a first single-electron device comprising a first conductive island insulatively disposed over the semiconductor substrate, at least two first tunnel barriers insulatively disposed over the semiconductor substrate, the first conductive island being interposed between the first tunnel barriers, first and second electrodes insulatively disposed over the semiconductor substrate, the first conductive island being coupled with the first and second electrodes through the first tunnel barriers, respectively, and a first charge storage region insulatively disposed over the first conductive island; and a second single-electron device comprising a second conductive island insulatively disposed over the semiconductor substrate, at least two second tunnel barriers insulatively disposed over the semiconductor substrate, the second conductive island being interposed between the second tunnel barriers, third and fourth electrodes insulatively disposed over the semiconductor substrate, the second conductive island being coupled with the third and fourth electrodes through the second tunnel barriers, respectively, and a second charge storage region insulatively disposed over the second conductive island, the third electrode of the second-single electron device being connected to the first electrode of the first single-electron device.

BRIEF DESCRIPTION OF THE SEVERAL VIEWS OF THE DRAWING

FIG. 7 shows input and output wave patterns of the logic device according to the first embodiment;

FIG. 8 shows a circuit diagram of the logic device according to the first embodiment;

DETAILED DESCRIPTION OF THE INVENTION

An embodiment of the present invention is explained referring to accompanying drawings in detail.

Figure 1:
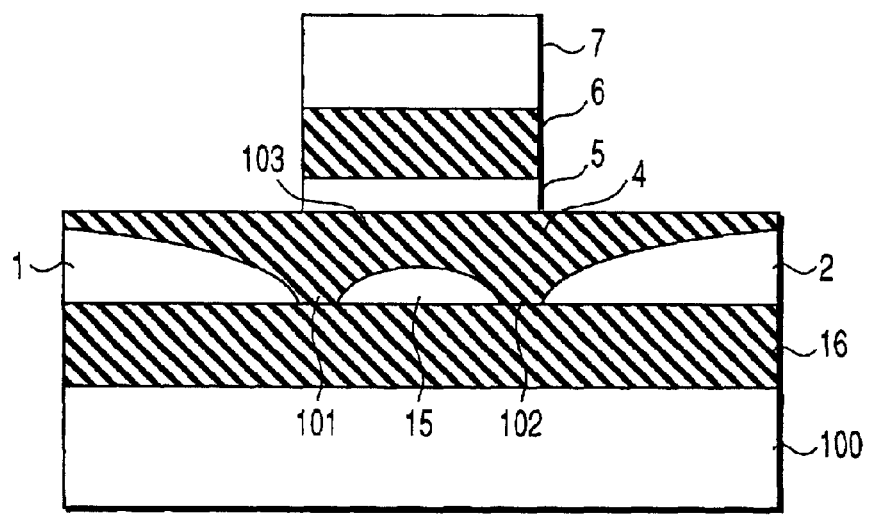
FIG. 1 shows a cross-sectional view of a logic element constructing a logic device according to an embodiment of the invention.

FIG. 1 shows a sectional view of a logic element used for a logic device according to an embodiment of the present invention, the logic element being a configuration element of the smallest unit. This logic element has a structure wherein charge storage regions are opposed to each other in a conductive island of a single-electron device.

As shown in FIG. 1, an insulation film 16 of silicon oxide is formed on a semiconductor substrate 100 formed of silicon. A conductive island 15 formed of silicon and the like is formed on the insulation film 16. The conductive island 15 is buried in an insulation film 4 of silicon oxide which is formed on the insulation film 16. First and second electrodes 1 and 2 are formed above the semiconductor substrate 100 with the insulation film 16 interposed. The first and second electrodes 1 and 2 are buried in the insulation film 4. The first and second electrodes 1 and 2 are arranged on both sides of the conductive island 15.

The insulation film 4 between the first electrode 1 and the conductive island 15 acts as a tunnel insulation film 101. For example, electrons are injected as charges from the first electrode 1 to the conductive island 15 through the tunnel insulation film 101. The insulation film 4 between the second electrode 2 and the conductive island 15 acts as a tunnel insulation film 102. For example, electrons can be extracted as charges from the conductive island 15 to the second electrode 2 through the tunnel insulation film 102. Of course, the charges can be injected from the electrode 2 and extracted from the electrode 1. Further, the conductive island 15 can store the charges.

The above structure provides a single-electron device capable of controlling movements of the individual electrons. A charge storage region 5 made of polysilicon is provided above the conductive island 15, with an insulation film 4 interposed. A gate insulation film 6 made of silicon oxide, for example, is formed on the charge storage region 5. A third electrode 7 made of polysilicon and the like is formed on the gate insulation film 6.

The electrodes such as the first electrode 1, the second electrode 2 and the third electrode 7 indicate comprehensive electrodes. If the electrodes have a resistance lower than that of the tunnel insulation film 101 or 102, they may be formed of metal materials, semiconductor or organic materials, etc. A part of the insulation film 4 between the conductive island 15 and the charge storage region 5 acts as a tunnel insulation film 103. By making a potential of the third electrode 7 vary, electrons can move between the conductive island 15 and the charge storage region 5. In this way, charges can be injected into the charge storage region 5 or extracted therefrom.

The above structure indicates a memory structure that can accumulate electrons, for example, as charges in the charge storage region 5. The logic element constructed in this way can expect a low power consumption in virtue of the structure of a single-electron device and a memory function in virtue of the use of the charge storage region 5. The charge storage region 5 is faced to the conductive island 15, with the tunnel insulation film 103 interposed.

It is possible to make the energy state of the conductive island 15 vary according to a case of charges stored in the charge storage region 5 and a case of no stored charge thereby to vary Coulomb oscillation of the single-electron device. It is explained in detail about this characteristic later.

Figure 2:
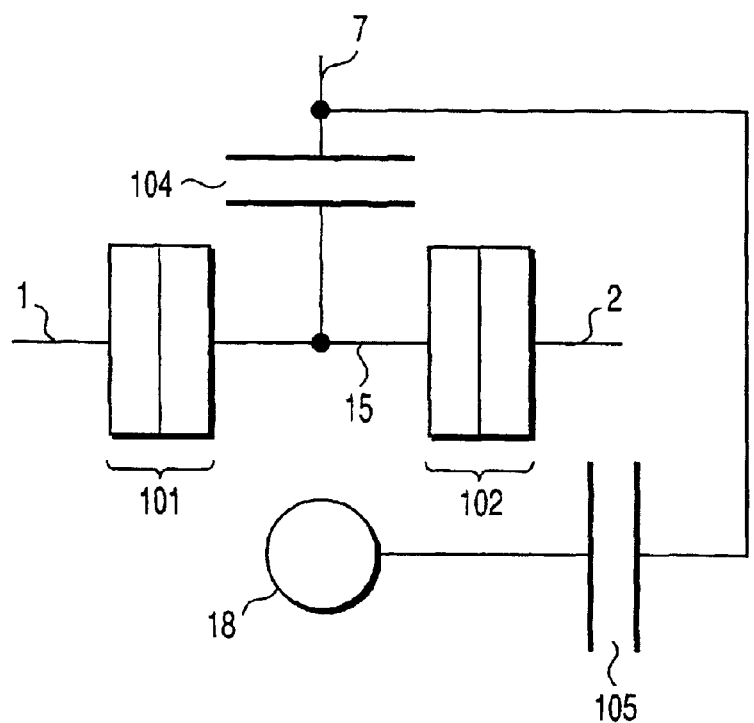
FIG. 2 shows a circuit diagram of a logic element constructing the logic device shown in FIG. 1.

FIG. 2 shows an equivalent circuit corresponding to the logic element shown in FIG. 1. In FIG. 2, references 1 and 2 indicate the first and second electrodes 1 and 2 in FIG. 1, respectively. The reference numeral 15 expresses the conductive island 15 in FIG. 1. The tunnel insulation film 101 is interposed between the conductive island 15 and the first electrode 1. The tunnel insulation film 102 is interposed between the conductive island 15 and the second electrode 2. The reference numeral 7 indicates the third electrode 7 in FIG. 1. A reference numeral 18 indicates the charge storage region 5 in FIG. 1. In this case, charges are not stored in the charge storage region 5. The conductive island 15 is coupled with the third electrode 7 by a capacitor 104.

The capacitor 104 is a combination of a capacitor formed by the conductive island 15, the tunnel insulation film 103 and the floating gate 5 and a capacitor formed by the floating gate 5, the gate insulation film 6 and the third electrode 7. The third electrode 7 and the charge storage region 5 (indicated by a state 18 storing no electron) are coupled by the capacitor 105. The capacitor 105 is a capacitor formed by the electrode 7, the gate insulation film 6 and the third floating gate 5 in FIG. 1.

Figure 3:
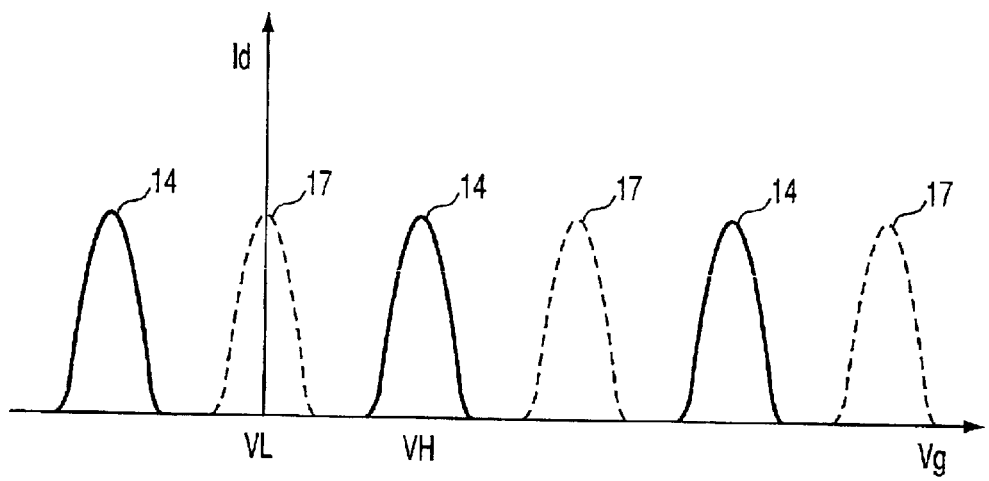
FIG. 3 shows a current voltage characteristic of a logic element constructing the logic device shown in FIG. 1.

FIG. 3 shows the current voltage characteristic wherein the ordinate axis indicates a current $1d$ flowing between the first electrode 1 and the second electrode 2 of the logic element shown in FIG. 1 and the abscissa axis indicates a voltage Vg applied to the third electrode 7. In FIG. 3, a current voltage characteristic indicated by a solid line 14 expresses a state that no electron charge is accumulated in the charge storage region 5. A current voltage characteristic indicated by a broken line 17 expresses a state that no charge is accumulated in charge storage region 5. These current voltage characteristics show an oscillation characteristic as shown in FIG. 3. This oscillation is referred to as a Coulomb oscillation.

As shown in FIG. 3, the Coulomb oscillation is shifted by a half period according to a state of the charges stored in the charge storage region 5 and a state storing no charge therein. In order to design the logic element wherein the Coulomb oscillation is shifted by a half period, an energy level of the conductive island 15 is set by selecting the size and materials of the conductive island 15. A shifting quantity can be adjusted by a quantity of charges stored in the charge storage region 5.

The voltage to be applied to the third electrode 7 to generate the first peak of Coulomb oscillation in the state that no charge is accumulated in the charge storage region 5 is assumed as VH indicating a high level. The voltage to be applied to the third electrode 7 to generate the first valley of Coulomb oscillation in the state that no charge is accumulated in the charge storage region 5 is assumed as VL indicating a low level. In this case, when the voltage VL is applied to the third electrode 7 in the state that no charge is accumulated in the charge storage region 5, the Coulomb oscillation represents valley as shown in FIG. 3, in other words, a current is rendered OFF. When the voltage VH is applied to the third electrode 7, the Coulomb oscillation indicates a peak as shown in FIG. 3, that is to say, a current is rendered ON.

When the charges are accumulated in the charge storage region 5, the Coulomb oscillation shifts a half period as shown in broken line 17 in FIG. 3. When the Coulomb oscillation shifts a half period, the voltage VL makes a peak in the Coulomb oscillation, namely a current is rendered ON. The voltage VH makes a valley in the Coulomb oscillation, that is, a current is rendered OFF. More specifically, in the state that charges are accumulated in the charge storage region 5 and the state that no charge is accumulated therein, the output is inverted between the voltages VL and VH.

Figure 4A:
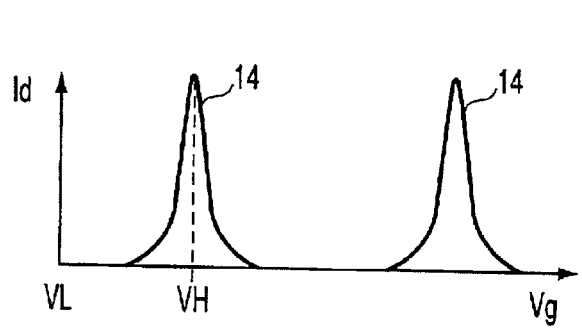
FIGS. 4A to 4D show a current voltage characteristic and a circuit diagram of a logic element constructing the logic device shown in FIG. 1.
Figure 4B:
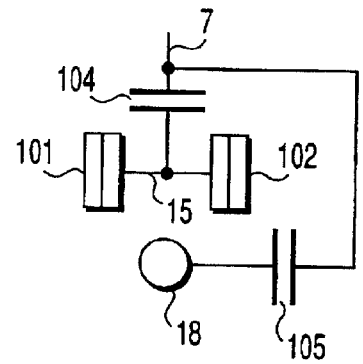
Figure 4C:
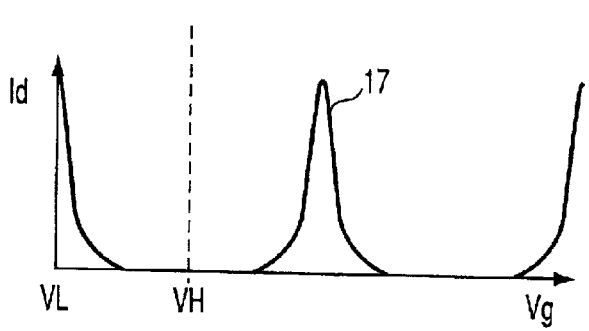
Figure 4D:
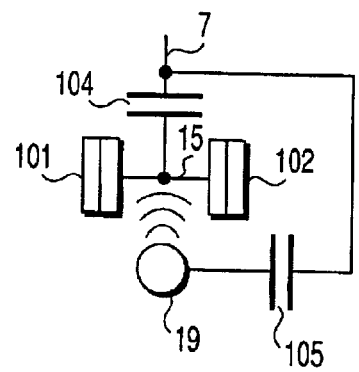

FIG. 4A shows a current voltage characteristic in the state that no charge is accumulated in the charge storage region 5 of the logic element, and FIG. 4B shows an equivalent circuit of the logic element in this characteristic. FIG. 4C shows a current characteristic in a state that charges are accumulated in the charge storage region 5, and FIG. 4D shows an equivalent circuit of the logic element in this characteristic. In FIGS. 4B and 4D, the reference 18 shows a state that no charge is accumulated in the charge storage region 5, and the reference 19 shows a state that charges are accumulated in the charge storage region 5.

In a state that charges are accumulated in the charge storage region 5 and a state that no charge is accumulated in the charge storage region 5 as shown in FIGS. 4B and 4D, the levels of currents flowing in the first and second electrodes 1 and 2 vary according to the voltage applied to the third electrode 7. In other words, ON and OFF of the current are inverted according to the voltage applied to the third electrode 7. More specifically, the logic element of the embodiment indicates a logical inversion in correspondence with the circuit state changing according to the input voltage applied to the third electrode 7 as shown in FIG. 4B and FIG. 4D.

Assuming as A the output of the logic element of the state (FIG. 4B) that no charges are accumulated in the charge storage region 5, and as B the output of the logic element of the state (FIG. 4D) that charges are accumulated in the charge storage region 5, the following logical equation (1) is established:

$$B = NOT(A) \quad (1)$$

In the present embodiment, a device indicating a logical inversion relation in the state that no charges are accumulated in the charge storage region 1 and the state that charges are accumulated therein is used as the logic element. A plurality of logic elements thus fabricated are combined to build up a logic device. A logic operation can be changed by changing a program of the memory of the LSI chip which is fabricated by integrating a lot of logic elements provided with a function to store the optimum logic operation. Therefore, basic LSI chips can be mass-produced, and improvement of yield can be expected. It is possible to set up various functions to a LSI chip by changing memory contents of the LSI chip according to a use. The configuration of a concrete logic device is described hereinafter.

(First Embodiment)

In First embodiment, like reference numerals are used to designate like structural elements corresponding to those like in FIGS. 1 and 2 and any further explanation is omitted for brevity's sake.

Figure 5:
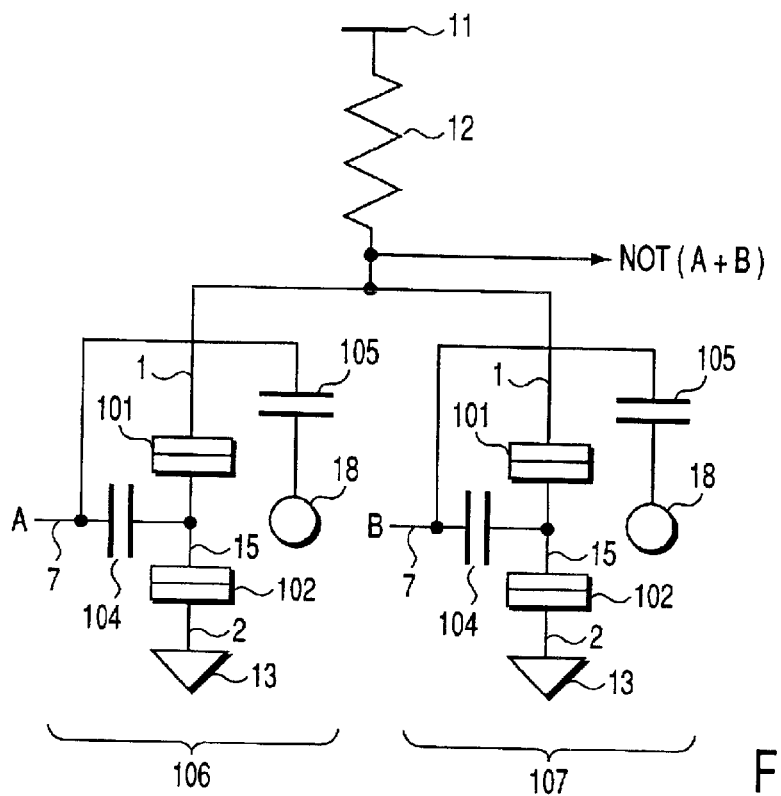
FIG. 5 shows a circuit diagram of a logic device hanging in a first embodiment of the present invention.

FIG. 5 shows a basic logic circuit in which two logic elements each explained referring to FIGS. 1 and 2 are connected in parallel. In FIG. 5, the first electrode 1 of the first logic element 106 is connected to the first electrode 1 of the second logic element 107. These first electrodes 1 are connected to a power supply 11 of voltage VH via a load resistor 12. The second electrode 2 of the first logic element 106 is connected to a ground 13 of voltage VL. The second electrode 2 of the second logic element 107 is connected to the ground 13. The first and second logic elements 106 and 107 are on the state 18 that no charge is accumulated in the charge storage region 5.

The voltage A (VL or VH) is applied to the third electrode 7 of the first logic element 106, and the voltage B (VL or VH) is applied to the third electrode 7 of the second logic element 107. This circuit outputs from the first electrode 1 connecting the first logic element 106 and the second logic element 107 to each other. In this time, when the voltages A and B are VH together, a current flows as shown in FIG. 4A. Thus, the first electrode 1 is applied with VL by the voltage drop of the load resistor 12. When the voltages A and B are VL together, no current flows through the logic element. Thus, the first electrode 1 is applied with the voltage VH. When one of voltage A and B is VH and the other is VL, a current flows through one of the logic elements. Therefore, the output of the first electrode 1 indicates VL by voltage drop in the load resistor 12. when VL=0 and VH=1, the operation result from the first electrode is NOT (A+B). The so-called NOR is formed.

Next, if the charge storage region 5 of only the first logic element 106 is accumulated with charges, the output of the first logic element 106 becomes NOT(A) according to the equation (1). Therefore, the operation output is NOT (NOT (A)+B). When De Morgan's rules are used, the operation output becomes A*NOT (B).

In contrary, no charge is accumulated in the charge storage region 5 of the first logic element 106 but charges are accumulated in the charge storage region 5 of the second logic element 107. In this time, the output of the second logic element 107 becomes NOT(B) according to the equation (1). Therefore, the operation output is NOT (A+NOT (B)). When De Morgan's rules are used, the operation output becomes NOT(A)*(B).

Figure 6:
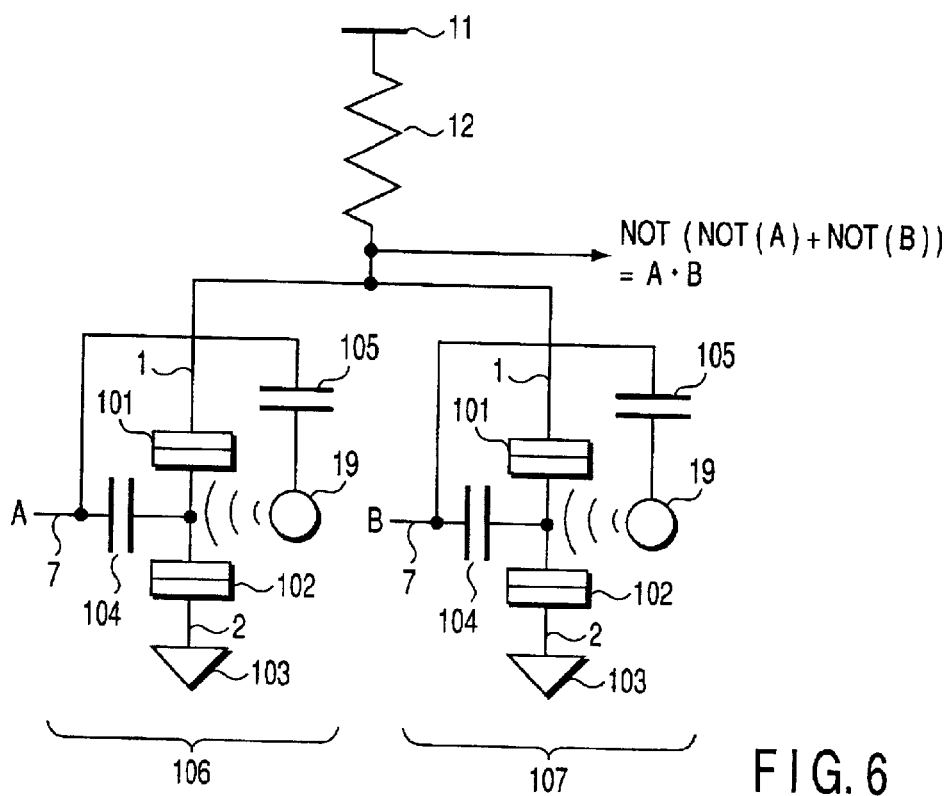
FIG. 6 shows a circuit diagram of a logic device according to the first embodiment.

FIG. 6 shows a state 19 that the charge storage regions 5 of both the first logic element 106 and the second logic element 107 are accumulated with charges. In this case, when an equation (1) is used, the output of the first logic element 106 becomes NOT (A), and the output of the second logic element 107 become NOT (B). Therefore, the operation output is NOT (NOT (A)+NOT (B)). When the De Morgan's rules are used, the output becomes A*B. The logic element becomes a so-called AND operation.

FIG. 7 shows output wave patterns of NOT (A+B), A*NOT (B), NOT (A)*B and A*B in respect to the wave pattern A input to the first logic element 106 and the wave pattern B input to the second logic element 107. In this way, the logic device enables to perform four logic operations of NOR, A*NOT (B), NOT (A)*B, and AND by the state that charges are accumulated in the charge storage region or the state that no charge is accumulated therein. Further, the two logic elements can realize a high programming performance.

FIG. 8 shows a second embodiment wherein an amplifier 21 is connected to the first electrode 1 of the logic circuit shown in FIG. 6. It is preferable for making a single-electron device function more effectively that the voltage of power supply 11 to be applied to a logic tree including the single-electron device is decreased less than (VH−VL) and an amplifier is connected to the output of the logic tree to set the input voltage to the next stage to a value between VH and VL. As thus described, the voltage of power supply 11 can be decreased by connecting an amplifier 21 to the output of the logic tree.

Figure 9A:
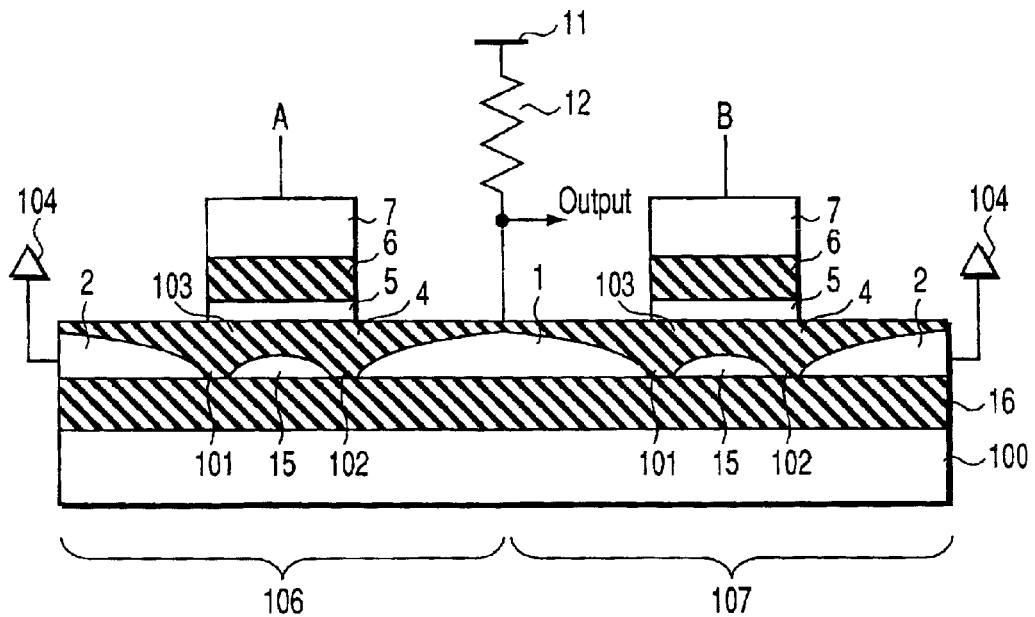
FIGS. 9A and 9B show sectional and plane views of the logic device fabricated by integrating logic elements according to the first embodiment.
Figure 9B:
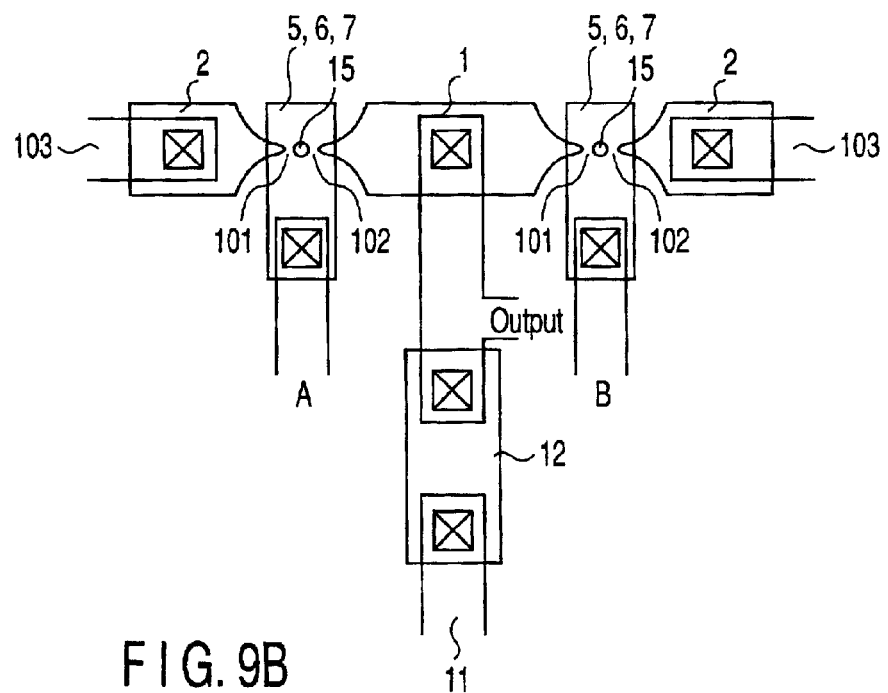

FIGS. 9A and 9B how a logic device obtained by integrally fabricating a circuit shown in FIG. 5 using two logic elements each shown in FIG. 1. As shown in FIGS. 9A and 9B, the first electrode 1 of the first logic element 106 and the first electrode 1 of the second logic element 107 are formed of a common electrode region, and is connected to the power supply 11 via the load resistor 12. The second electrode 2 of the first logic element 106 and the second electrode 2 of the second logic element 107 are connected to the ground 104. The conductive island 15 of the first logic element 106 is arranged between the second electrode 2 and the common electrode region 1. The conductive island 15 of the second logic element 107 is arranged between the second electrode 2 and the common electrode region 1.

Logic signals A and B are input to the third electrode 7 of the first logic element 106 and the third electrode 7 of the second logic element 107 respectively. The charges such as electrons or holes can be injected into or extracted from the charge storage region 5 by forming a potential difference between the first electrode 1 or the second electrode 2 and the third electrode 7. The logic element has memory effect in this way.

(Second Embodiment)

In Second embodiment, like reference numerals are used to designate like structural elements corresponding to those like in FIGS. 1, 2, 4A–4D, 5 and 6 and any further explanation is omitted for brevity's sake.

Figure 10:
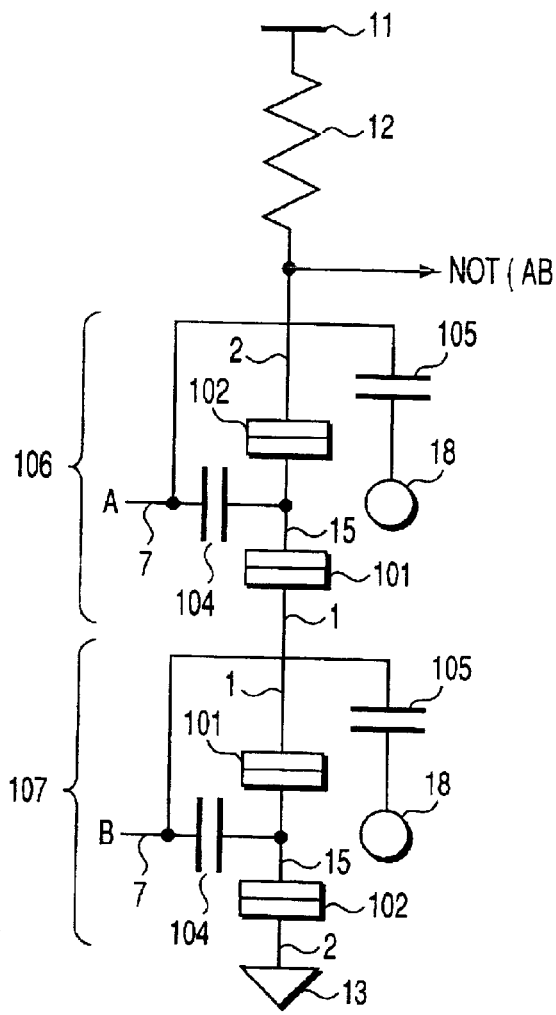
FIG. 10 shows a circuit diagram in a logic operation of a logic device according to a second embodiment of the present invention.

FIG. 10 shows a basic logic circuit in which two logic elements are serially-connected, each of the two logic elements corresponding to the logic element explained referring to FIGS. 1 to 4D. In FIG. 10, the first electrode 1 of the second logic element 107 is connected to the first electrode 1 of the first logic element 106. The second electrode 2 of the first logic element 106 is connected to the power supply 11 of voltage VH via the load resistor 12. The second electrode 2 of the second logic element 107 is connected to the ground 13 of voltage VL. The first and second logic elements 106 and 107 are the state 18 that no charge is stored in the charge storage region 5.

The voltage A (VL or VH) is input to the third electrode 7 of the first logic element 106, and the voltage B (VL or VH) is input to the third electrode 7 of the second logic element 107. In this time, when the voltages A and B are VH together, a current flows as shown in FIG. 4B. The output of the first electrode 1 is decreased to VL by a voltage drop of the load resistor 12. When the voltages A and B are VL together, no current flows in the logic element. Therefore, the output of the first electrode 1 becomes VH. When one of the voltages A and B is VH and the other is VL, no current flows in one of the logic elements. Therefore, the output of the first electrode 1 becomes VH.

When VL=0 and VH=1, the operation result output by the first electrode 1 is NOT (A*B). This is so-called NAND. When the charges are accumulated in the charge storage region 5 of only the first logic element 106, the output of the first logic element 106 is NOT (A) according to the equation (1). Therefore, the operation output becomes NOT (NOT (A)*B). When the De Morgan's rules are used, the output is A+NOT (B). In contrary, no charge is accumulated in the charge storage region 5 of the first logic element 106, but charges are accumulated in the charge storage region 5 of the second logic element 107. In this time, the output of the second logic element 107 becomes NOT (B) according to the equation (1). Therefore, the operation output becomes NOT (A*NOT (B)). When the De Morgan's rules are used, the output is NOT(A)+B.

Figure 11:
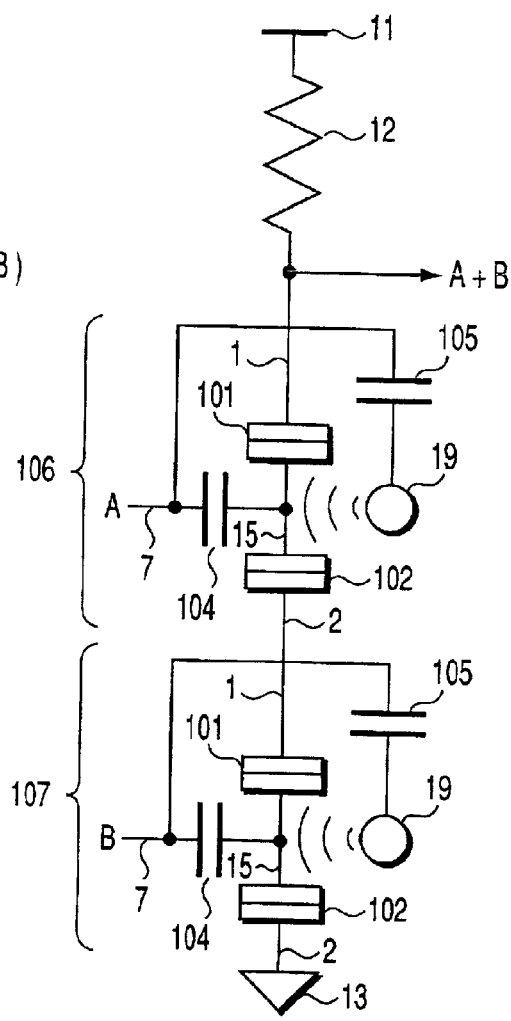
FIG. 11 shows a circuit diagram in another logic operation of the logic device according to the second embodiment.

FIG. 11 shows a state 19 that the charge storage regions 5 of both the first logic element 106 and the second logic element 107 are accumulated with charges. In this case, when the equation (1) is used, the output of the first logic element 107 is NOT(A), the output of the second logic element is NOT(B), and the operation output is NOT (NOT (A)*NOT (B)). When the De Morgan's rules are used, the logic circuit is so-called OR circuit.

Figure 12:
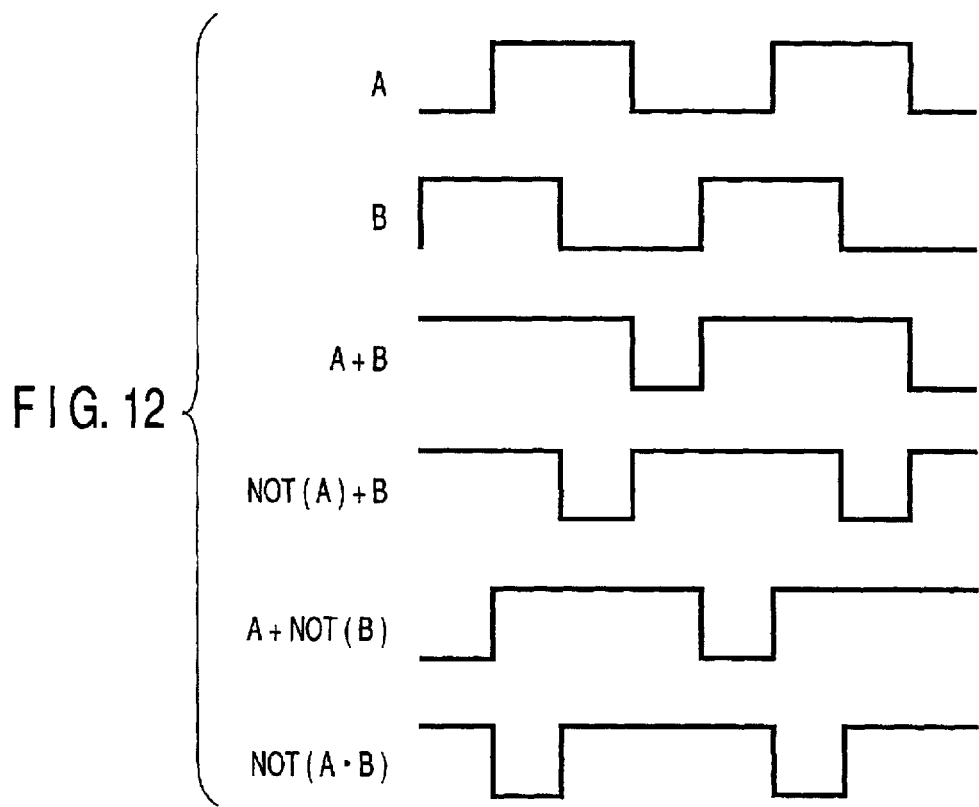
FIG. 12 shows input and output wave patterns of the logic device according to the second embodiment.

FIG. 12 shows output wave patterns of A+B, NOT (A)+B, A+NOT (B) and NOT(A*B) in respect to the wave pattern A input to the first logic element 106 and the wave pattern B input to the second logic element 107. As thus described, the logic device enables to perform four logic operations of A+B, NOT (A)+B, A+NOT(B), and NOT(A*B) by the state that charges are accumulated in the charge storage region or the state that no charge is accumulated therein. Further, the two logic elements can realize a high programmability.

Figure 13B:
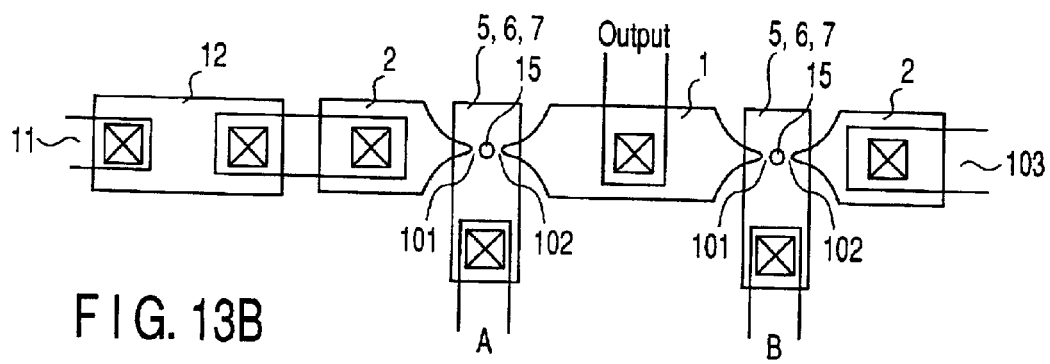
FIGS. 13A and 13B shows sectional and plane views of a logic device fabricated by integrating logic elements according to the second embodiment.
Figure 13A:
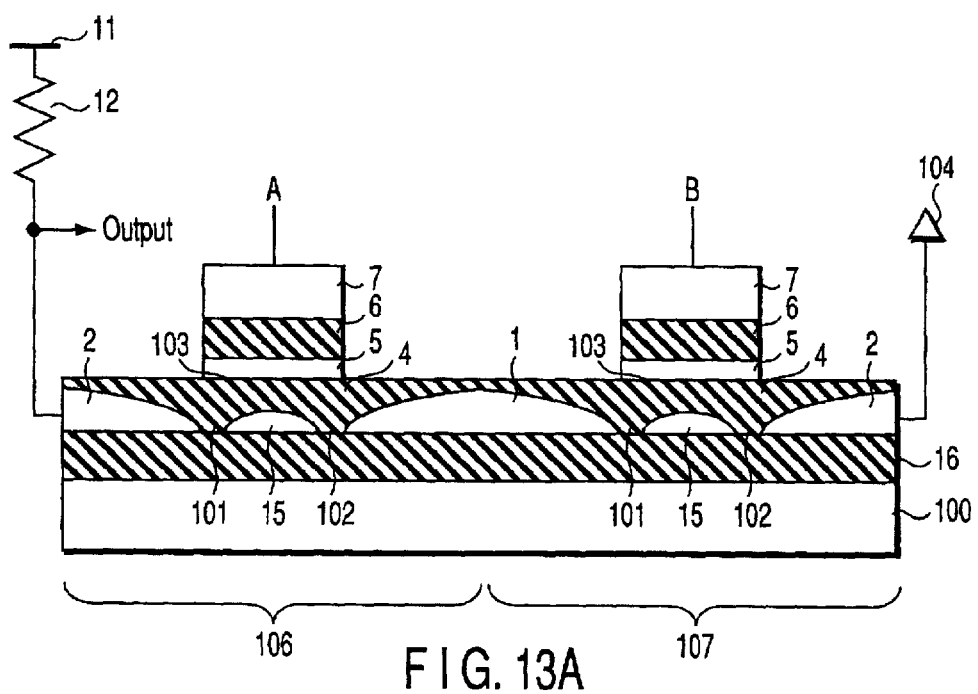

FIGS. 13A and 13B show an integrated logic device obtained by fabricating a circuit shown in FIG. 10 by means of a logic element shown in FIG. 1. As shown in FIGS. 13A and 13B, the first electrode 1 of the first logic element 106 and the first electrode 1 of the second logic element 107 are formed of a common electrode region. The second electrode 2 of the first logic element 106 is connected to the power supply 11 via the load resistor 12. The second electrode 2 of the second logic element 107 is connected to the ground 104. The conductive island 15 of the first logic element 106 is arranged between the second electrode 2 and the common electrode region 1. The conductive island 15 of the second logic element 107 is arranged between the second electrode 2 and the common electrode region 1.

Logic signals A and B are input from the third electrode 7 of the first logic element 106 and the third electrode 7 of the second logic element 107, respectively. The charges of electrons or holes can be injected into or extracted from the charge storage region 5 by forming a potential difference between the first electrode 1 or the second electrode 2 and the third electrode 3. The logic element has memory effect in this way. When LSI is made by a semiconductor chip really, a basic LSI chip may be fabricated by combining basic logic operation trees shown in the embodiments 1 and 2 together.

Figure 14:
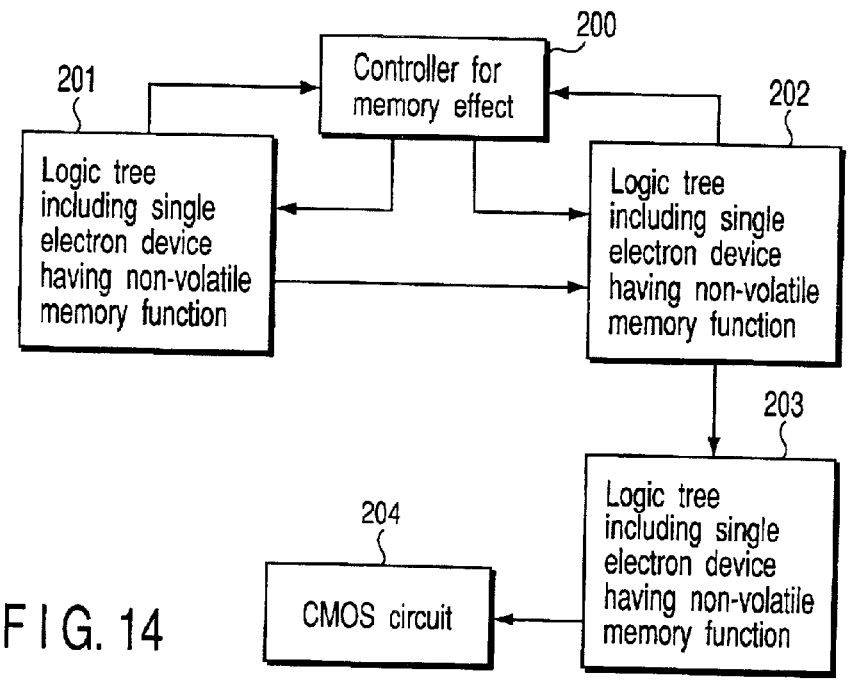
FIG. 14 shows a block diagram of a control unit controlling a program of a logic device according to an output of a logic tree.

FIG. 14 shows a procedure of program control of LSI containing an operation unit including a logic tree comprising logic elements having a nonvolatile memory function and a control circuit controlling a program state of a logic element according to an output of the logic tree. As shown in FIG. 14, a control circuit 200 for memory effect can program logic trees 201 and 202 comprised by single-electron devices having a nonvolatile memory effect. The logic trees 201 and 202 have a feed back function so that the control circuit 200 can understand how a program state of the logic trees 201 and 202 becomes.

The logic trees 201 and 202 are integrated in different regions on a LSI chip. It is possible to output a logic operation result from the logic tree 201 to the logic tree 202. It is possible to output a logic operation result from the logic tree 202 to the logic tree 203. In this time, the logic tree 203 performs a logic process which a program is fixed. An output of the logic tree 203 is output to a CMOS circuit 204 and subjected to a process of the amplification and so on. It is desirable that a switching element controlling whether a control signal is to be transmitted is built in the inside of a program control circuit.

Figure 15:
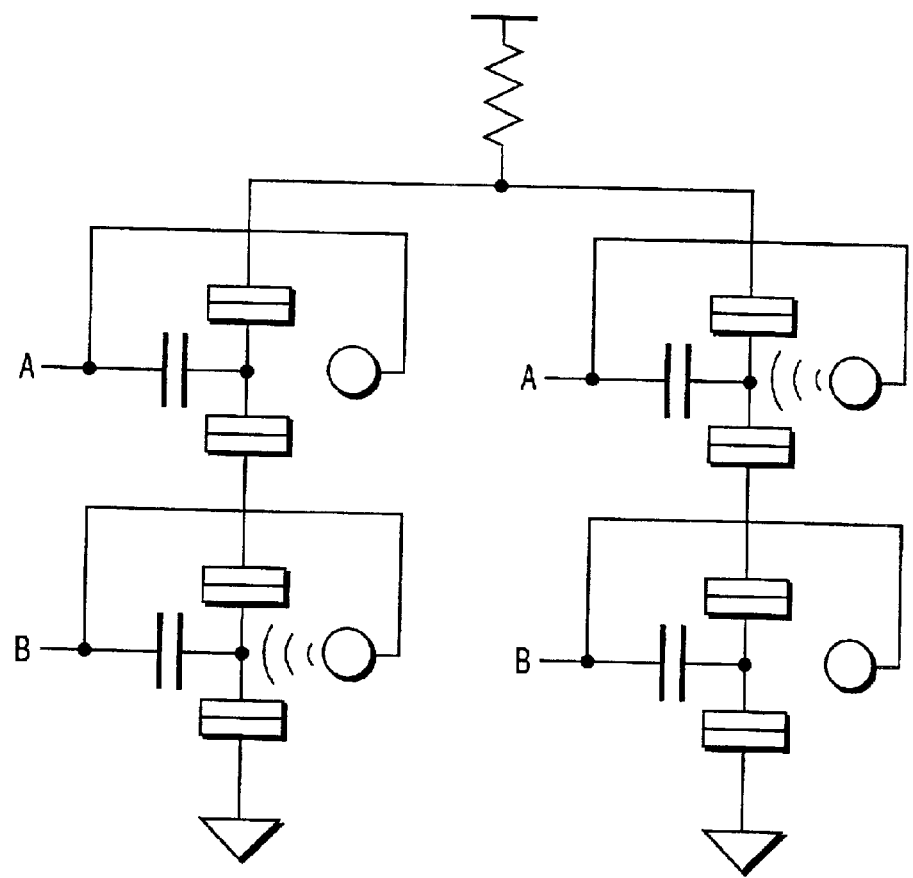
FIG. 15 shows a logic circuit of a combination of the logic circuits shown in FIGS. 5 and 10.

FIG. 15 shows a logic circuit which put a logic circuit in which two logic elements shown in FIG. 5 are connected in parallel, and a logic circuit in which two logic elements shown if FIG. 10 are serially-connected. In other words, a pair of elements are connected in series, and two pairs of them are connected in parallel, so that Two-input exclusive OR (EXOR) is realized. As thus described, an arbitrary logic function can be realized by a combination of the logic circuits.

Figure 16:
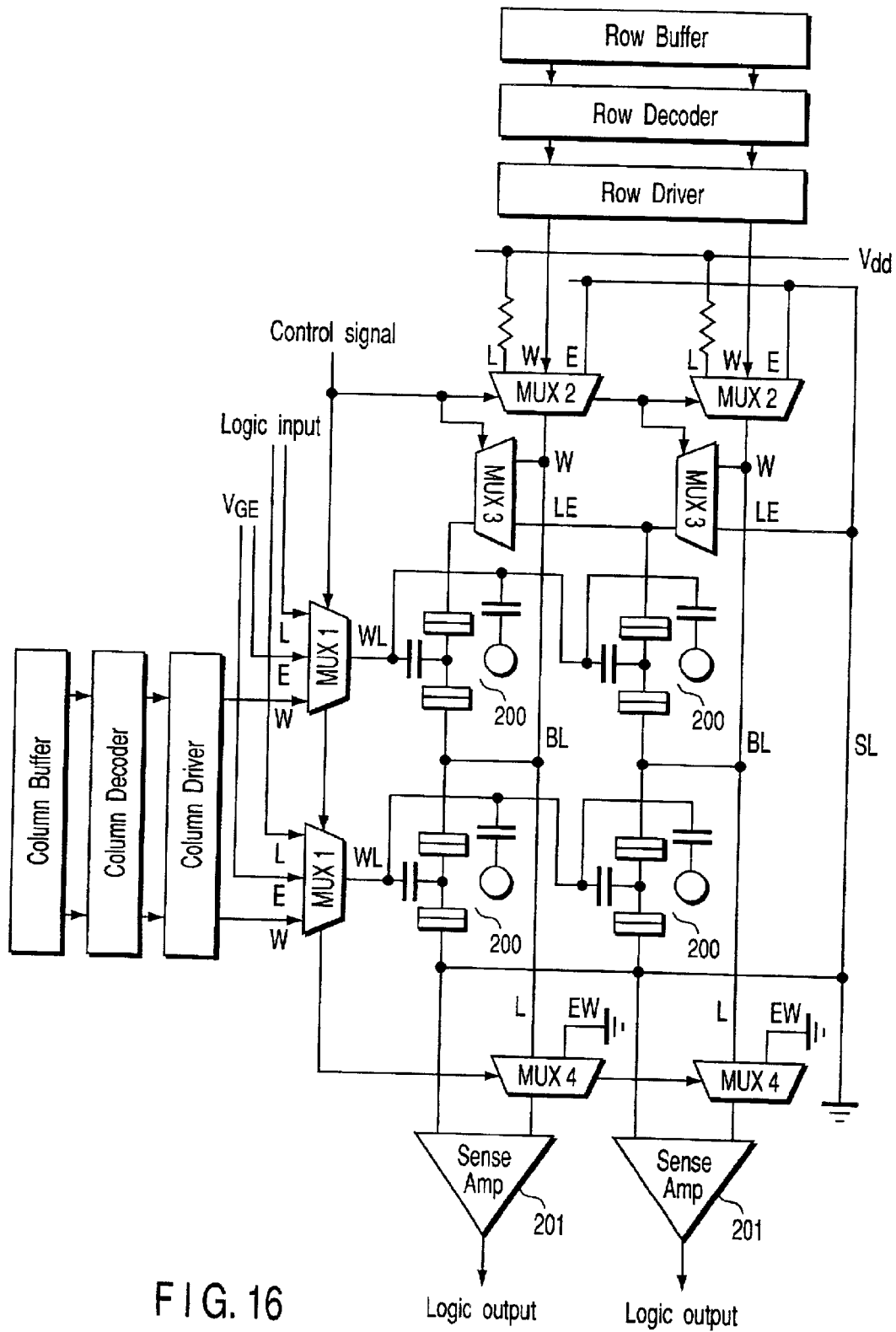
FIG. 16 shows a circuit of a logic device which includes a peripheral circuit.

FIG. 16 shows a programmable logic array (logic circuit apparatus) using single-electron devices 200 (single-electron transistors) having a nonvolatile memory function. The single-electron devices 200 are connected in parallel to one another in a vertical direction, to construct a NOR gate. An array structure is constructed by arraying plural element arrays each constructing the NOR gate.

The operation of the logic circuit is controlled by a control signal 1 of 2 bits. MUX indicates a switch to select a signal corresponding to the control signal from a plurality of input signals, referred to as a multiplexer. If the multiplexer selects an appropriate output signal based on a control signal, operation states of 1) a state to perform a logic operation, 2) a state to perform programming, namely writing and 3) a state to erase programmed information can be changed.

An operation of the programmable logic array having a 2×2 single-electron device array shown in FIG. 16 is explained in conjunction with a Table 1 showing a voltage condition.

TABLE 1

| | Logic opera-tion (L) | Writing (W) | | Clear (E) | |
| --- | --- | --- | --- | --- | --- |
| | | Select | Non-select | Select | Non-select |
| Word line (WL) | Logic input | 8 V  15 V | 8 V  0 V | −15 V | — |
| Bit line (BL) | Vdd | 50 mV | Floating  50 mV | 0 V | — |
| Sense line (SL) | 0 V | 50 mV | Floating  50 mV | 0 V | — |

In a logic operation state, the multiplexers MUX1 to MUX5 select a signal from a signal line L of FIG. 16. A logic signal inputs to the array through the multiplexer MUX1. The single-electron devices arranged in the vertical direction via the multiplexers MUX2 and MUX3 are connected in parallel to construct an NOR gate. The NOR gate uses a resistor as a load and is biased by a source voltage Vdd smaller than the amplitude of the logic input. To a sense amplifier 205 which is a differential amplifier amplifying a minute signal through the multiplexer MUX4 are supplied the output of the NOR gate and the ground potential as a reference potential. A minute output of a NOR gate is amplified to an amplitude similar to that of the logic signal by the sense amplifier to enable to drive a gate of the next stage. If such NOR gate planes are cascade-connected at two stages, the logic circuit becomes a standard logical addition type. Accordingly, the logic circuit can perform arbitrary logic operation. The programmable logic array of MOSFETs needs two devices in order to perform a complementary operation for one logic input. In contrast, a programmable logic array of single-electron devices can perform a complementary operation with one device. Therefore, the number of single-electron devices constructing the single-electron array becomes ½ of that of the MOSFET array.

In a programming, namely a writing operation state, the multiplexers MUX1 to MUX5 select a signal from the signal line W of FIG. 16. Writing is executed in two steps.

Figure 18A:
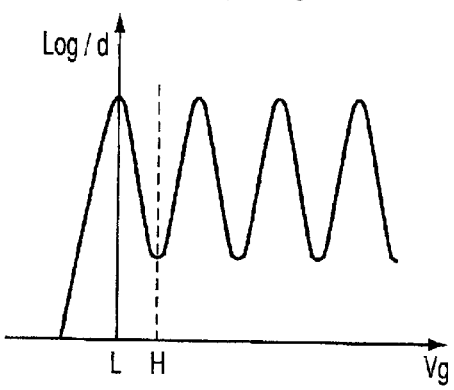
FIGS. 18A and 18B show a writing current voltage characteristic and a circuit diagram of a logic element constructing the logic device shown in FIG. 16.
Figure 18B:
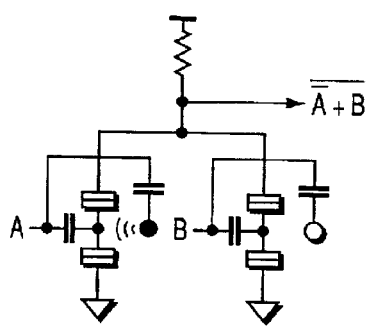

In the first writing step, writing is executed with the phase being shifted by half period, an inverted signal occurs. This first writing step is explained as the writing gate voltage to be 8 V. At first, a signal based on address information inputs to the array via the multiplexers MUX1 and MUX2. From a row driver, a signal of 0 V inputs to a selection row and a signal of 8 V to a non-selection row. A column driver inputs a signal of 50 mV to a selection column, but a non-selection column is in a floating state. As a result, the writing is performed only by the element selected with both row and column addresses, the phase shifts a half period, and logical NOR is output. This condition is shown in FIGS. 18A and 18B. For the purpose of avoiding an unstable output from the sense amplifier in writing, the differential inputs to the sense amplifiers from the multiplexers MUX4 are set to ground potential together, and the outputs of the sense amplifiers are set to 0 V.

Figure 19A:
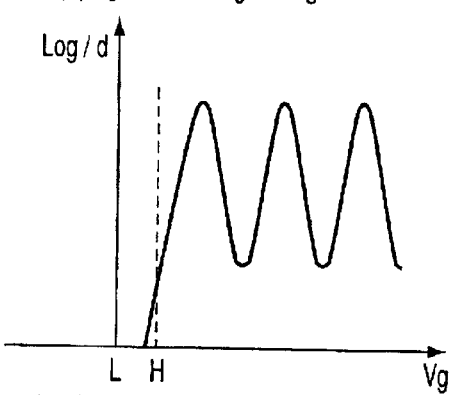
FIGS. 19A and 19B show a writing current voltage characteristic and a circuit diagram of a logic element constructing the logic device shown in FIG. 16.
Figure 19B:
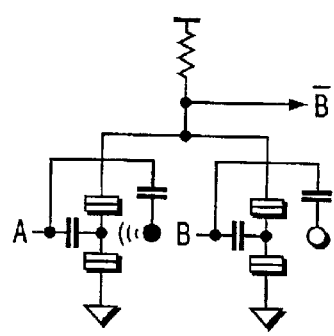

The second writing step performs a surplus writing. The writing gate voltage to be necessary for this writing is set to 15 V. As shown in FIGS. 19A and 19B, the single-electron device of the present embodiment is substantially formed of a MOSFET. Therefore, when the surplus writing is executed, no current flows regardless of the input voltage in a logic operation state. From the row driver, a signal of 15 V inputs to the selection row and a signal of 0 V inputs to the non-selection row. The column driver inputs a signal of 50 mV to the selection column but the non-selection column is in a floating state. The element designated by both addresses of row and column is increased in a threshold value, so that it does not function in a logic operation state. This condition is shown in FIG. 19A.

Figure 17A:
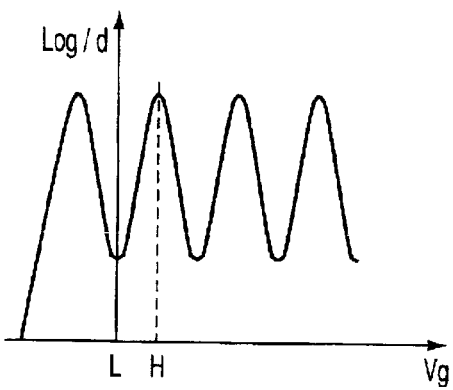
FIGS. 17A and 17B show an initial current voltage characteristic and a circuit diagram of a logic element constructing the logic device shown in FIG. 16.
Figure 17B:
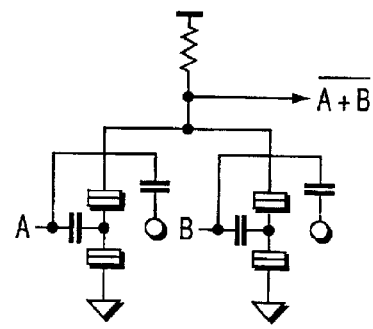

A clear is executed in a lump. In a clear operation state, the multiplexers MUX1 to MUX5 select a signal from the signal line E of FIG. 16. The gate voltage to be necessary for a clear is set to −15 V. This conduction is shown in FIGS. 17A and 17B. The voltage of a clear condition is applied to all single-electron devices via the multiplexers MUX1 and MUX2. For the purpose of avoiding an unstable output from the sense amplifier in the clear operation, the differential inputs to the sense amplifiers from the multiplexers MUX4 are set to ground potential together.

As described above, the programmable logic array comprising single-electron devices shown in FIG. 16 makes the number of elements ½ than a programmable logic array of MOSFET and provides a program performance equal to the array of MOSFET.

The logic device of FIG. 16 does not need an inversion signal in either of input and output, so that the circuit area becomes ½ of an area of PLA (Programmable Logic Array) using a flash memory. The present invention can provide a LSI that reconfigurable computing capable of expecting high yield improvement is possible.

The present invention introduces a high logic element of a high programmability, and the programmability of the system in itself (optimization ability) can be raised.

The present invention can realize decrease of the number of elements and reduction of a chip area by raising the programmability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A logic apparatus comprising:
    a semiconductor substrate;
    a first single-electron device comprising,
        a first conductive island insulatively disposed over the semiconductor substrate,
        at least two first tunnel barriers insulatively disposed over the semiconductor substrate, the first conductive island being interposed between the first tunnel barriers,
        first and second electrodes insulatively disposed over the semiconductor substrate, the first conductive island being coupled with the first and second electrodes through the first tunnel barriers, respectively, and
        a first charge storage region insulatively disposed over the first conductive island;
    a second single-electron device comprising,
        a second conductive island insulatively disposed over the semiconductor substrate,
        at least two second tunnel barriers insulatively disposed over the semiconductor substrate, the second conductive island being interposed between the second tunnel barriers,
        third and fourth electrodes insulatively disposed over the semiconductor substrate, the second conductive island being coupled with the third and fourth electrodes through the second tunnel barriers, respectively, and
        a second charge storage region insulatively disposed over the second conductive island; and
    a connection between the third electrode of the second single-electron device and the first electrode of the first single-electron device,
    wherein, for each of the first and second single-electron devices, a Coulomb oscillation in a state that charges are accumulated in the charge storage region is shifted by a half-period from the Coulomb oscillation in a state that no charge is accumulated therein.

2. A logic apparatus according to claim 1, further comprising an output amplifier connected to the first electrode of the first single-electron device and the third electrode of the second single-electron device.

3. A logic apparatus according to claim 1, wherein the first and second single-electron devices include fifth and sixth electrodes insulatively disposed over the first and second charge storage regions, respectively, logic signals are input to the fifth and sixth electrodes of the first and second single-electron devices, and a logic operation result is output from the first and third electrodes.

4. A logic apparatus according to claim 3, wherein the first electrode and the third electrode are formed of a common electrode region.

5. A logic apparatus according to claim 1, wherein the first and second single-electron devices include fifth and sixth electrodes insulatively disposed over the first and second charge storage regions, respectively, logic signals are input to the fifth and the sixth electrode of the first and the second single-electron device, and a logic operation result is output from the second electrode of the first single-electron device.

6. A logic apparatus according to claim 5, wherein the first electrode and the third electrode are formed of a common electrode region.

7. A logic apparatus according to claim 1, wherein each of the first and second single-electron devices has a logic inversion relation between a state that charges are accumulated in the charge storage region and a state that no charge is accumulated therein.

8. A logic apparatus according to claim 1, wherein each of the first and second single-electron devices further comprises an element configured to inject charges to the charge storage region or extract charges therefrom.

9. A logic apparatus according to claim 1, wherein each of the first and second single-electron devices further comprises an element configured to generate a potential difference between the conductive island and the charge storage region, in order to inject charges to the charge storage region or extract charges therefrom.

10. A logic apparatus according to claim 1, wherein, for each of the first and second single-electron devices, a size and materials of the conductive island are selectively set to shift the Coulomb oscillation by the half-period between the state that charges are accumulated in the charge storage region and the state that no charge is accumulated therein.

11. A logic apparatus comprising:
    a semiconductor substrate;
    a first single-electron device comprising,
        a first conductive island insulatively disposed over the semiconductor substrate,
        at least two first tunnel barriers insulatively disposed over the semiconductor substrate, the first conductive island being interposed between the first tunnel barriers,
        first and second electrodes insulatively disposed over the semiconductor substrate, the first conductive island being coupled with the first and second electrodes through the first tunnel barriers, respectively, and
        a first charge storage region insulatively disposed over the first conductive island;
    a second single-electron device comprising,
        a second conductive island insulatively disposed over the semiconductor substrate,
        at least two second tunnel barriers insulatively disposed over the semiconductor substrate, the second conductive island being interposed between the second tunnel barriers,
        third and fourth electrodes insulatively disposed over the semiconductor substrate, the second conductive island being coupled with the third and fourth electrodes through the second tunnel barriers, respectively, and a second charge storage region insulatively disposed over the second conductive island; and a connection between the third electrode of the second single-electron device and the first electrode of the first single-electron device;

a resistor between a node of the first electrode of the first single-electron device, the third electrode of the second single-electron device, and a voltage source; and at least one ground terminal connected to the second electrode of the first single-electron device and the fourth electrode of the second single-electron device.

12. A logic apparatus according to claim 1, further comprising a plurality of single-electron device pairs each including the first and second single-electron devices connected in parallel or serial.

13. A logic apparatus according to claim 1, further comprising a plurality of single-electron device pairs each including the first and second single-electron devices connected in parallel and serial.

14. A logic circuit comprising:

a first logic circuit using a single-electron device having an oscillation according to a voltage, a capacitor configured to selectively store charges, a first terminal, a second terminal, and a third terminal;

a second logic circuit using a single-electron device having an oscillation according to a voltage, a capacitor configured to selectively store charges, a first terminal connected to the first terminal of the first logic circuit, a second terminal, and a third terminal;

a resistor connected to a node of the first terminals of the first and second logic circuits and a voltage source;

a ground terminal connected to the second terminals of the first and second logic circuits; and logic signal input terminals, connected to the third terminals of the first and second logic circuit, inputted with logic signals.

15. A logic circuit according to claim 14, further comprising an output amplifier connected to the node of the first terminals of the first and second logic circuit.

16. A logic circuit according to claim 14, wherein a logic operation result is output from the first terminals of the first and second logic circuits.

17. A logic circuit according to claim 14, wherein a logic operation result is output from the second terminal of the first logic circuit.

18. A logic circuit according to claim 14, wherein each of the first and second logic circuits has a logic inversion relation between a state that charges are accumulated in the capacitor and a state that no charge is accumulated therein.

19. A logic circuit according to claim 14, which includes further comprising a circuit configured to inject charges to the capacitor or extract charges therefrom.

20. A logic circuit according to claim 14, further comprising a plurality of logic circuit pairs each including the first and second logic circuits connected in parallel or serial.

21. A logic circuit according to claim 14, further comprising a plurality of logic circuit pairs each including the first and second logic circuits connected in parallel and serial.

22. A logic apparatus comprising:

a semiconductor substrate;

a first single-electron device comprising, a first conductive island insulatively disposed over the semiconductor substrate, at least two first tunnel barriers insulatively disposed over the semiconductor substrate, the first conductive island being interposed between the first tunnel barriers, first and second electrodes insulatively disposed over the semiconductor substrate, the first conductive island being coupled with the first and second electrodes through the first tunnel barriers, respectively, and a first means for storing charges to vary an energy state of the first conductive island;

a second single-electron device comprising, a second conductive island insulatively disposed over the semiconductor substrate, at least two second tunnel barriers insulatively disposed over the semiconductor substrate, the second conductive island being interposed between the second tunnel barriers, third and fourth electrodes insulatively disposed over the semiconductor substrate, the second conductive island being coupled with the third and fourth electrodes through the second tunnel barriers, respectively, and a second means for storing charges to vary an energy state of the second conductive island; and a connection between the third electrode of the second-single electron device and the first electrode of the first single-electron device, wherein, for each of the first and second single-electron devices, a Coulomb oscillation in a state that charges are accumulated in the means for storing charges is shifted by a half-period from the Coulomb oscillation in a state that no charge is accumulated therein.

23. A logic apparatus according to claim 22, wherein the first and second single-electron devices include fifth and sixth electrodes insulatively disposed over the first and second means for storing charges, respectively, logic signals are input to the fifth and sixth electrodes of the first and second single-electron devices, and a logic operation result is output from the first and third electrodes.

24. A logic apparatus according to claim 22, wherein the first and second single-electron devices include fifth and sixth electrodes insulatively disposed over the first and second means for storing charges, respectively, logic signals are input to the fifth and sixth electrode of the first and second single-electron device, and a logic operation result is output from the second electrode of the first single-electron device.

25. A logic apparatus according to claim 22, wherein each of the first and second single-electron devices has a logic inversion relation between a state that charges are accumulated in the means for storing charges and a state that no charge is accumulated therein.

26. A logic apparatus comprising:

a semiconductor substrate;

a first single-electron device comprising, a first conductive island insulatively disposed over the semiconductor substrate, at least two first tunnel barriers insulatively disposed over the semiconductor substrate, the first conductive island being interposed between the first tunnel barriers, first and second electrodes insulatively disposed over the semiconductor substrate, the first conductive island being coupled with the first and second electrodes through the first tunnel barriers, respectively, and a first means for storing charges to vary an energy state of the first conductive island;

a second single-electron device comprising,
a second conductive island insulatively disposed over the semiconductor substrate,
at least two second tunnel barriers insulatively disposed over the semiconductor substrate, the second conductive island being interposed between the second tunnel barriers,
third and fourth electrodes insulatively disposed over the semiconductor substrate, the second conductive island being coupled with the third and fourth electrodes through the second tunnel barriers, respectively, and a second means for storing charges to vary an energy state of the second conductive island;

a connection between the third electrode of the second-single electron device and the first electrode of the first single-electron device;

a resistor between a node of the first electrode of the first single-electron device, the third electrode of the second single-electron device, and a voltage source; and at least one ground terminal connected to the second electrode of the first single-electron device and the fourth electrode of the second single-electron device.

* * * * *